United States Patent [19]

Ushiki et al.

[11] Patent Number: 4,701,748
[45] Date of Patent: Oct. 20, 1987

[54] KEY CIRCUIT

[75] Inventors: Hiroshi Ushiki, Yokohama; Tetsuaki Iwasaki, Tokyo, both of Japan

[73] Assignees: Kabushiki Kaisha Toshiba, Kawasaki; Tosbac Computer System Co., Ltd., Tokyo, both of Japan

[21] Appl. No.: 911,894

[22] Filed: Sep. 26, 1986

[30] Foreign Application Priority Data

Sep. 30, 1985 [JP] Japan ................. 60-216700

[51] Int. Cl.⁴ .................... G06F 3/02; G06F 1/04
[52] U.S. Cl. .................... 340/365 S; 340/365 R; 307/296 A; 364/707
[58] Field of Search ............ 340/365 S, 365 R, 365 E; 307/241, 242, 296 A; 364/707

[56] References Cited

U.S. PATENT DOCUMENTS 4,303,907 12/1981 Wilson ............................ 340/365 S
4,479,191 10/1984 Nojima et al. ..................... 364/707

Primary Examiner—John W. Caldwell, Sr.
Assistant Examiner—Alvin Oberley
Attorney, Agent, or Firm—Finnegan, Henderson, Farabow, Garrett & Dunner

[57] ABSTRACT

A plurality of key switches are provided between each pair of external terminals. A logic circuit generates time-division signals sequentially. The logic circuits stops the generation of these time-division signals during a blanking period with a predetermined time duration, thereby to stop the through-current during this period. The plurality of time-division signals are input to a plurality of buffer circuits. The outputs of the buffer circuits are supplied to the external output. Detection circuits detect only the operated key switches on the basis of the time-division signals and the signals from the external terminals exclusively used for key signal inputting. A plurality of switch members are provided between each of the external terminals and the reference potential. These switch members are conductive during the blanking period to improve the drive capability for external load.

6 Claims, 51 Drawing Figures

F I G. 5
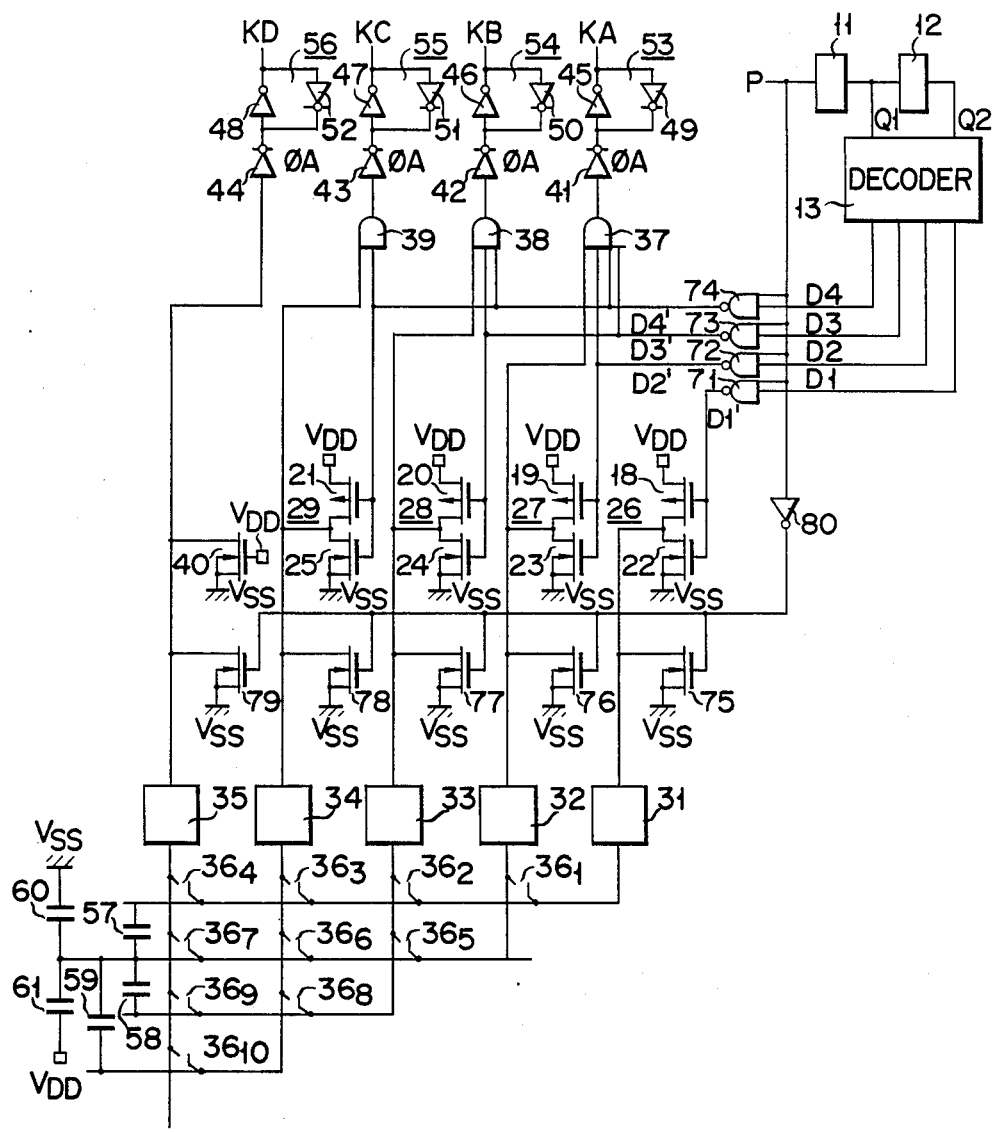

KEY CIRCUIT

BACKGROUND OF THE INVENTION

This invention relates to the key circuits used in small electronic calculators with key switches, and more particularly to key circuits contained in low power consumption integrated circuits or integrated circuits in which key switch on-resistance or load capacity may present a problem.

With the development of large scale integrated circuits, integrated circuits with CMOS (complementary metal oxide semiconductor) structure, particularly the clock synchronized type, $C^2$ (clock synchronized complementary) MOS structure, have been employed for electronic calculators or electronic clocks. With the use of these MOS structure integrated circuits, regardless of whether the circuits perform calculation or display functions, the power consumption can be limited to only several microamperes. Since the power consumption is small, solar cells can be used as a means of power supply. In this type of integrated circuits, the read-in of key signals is performed by using the difference of on-resistance between P-channel and N-channel MOS transistors. Accordingly, if the factors, such as duty of the pulse signal for controlling the ON/OFF operation of these transistors or on-resistances of these transistors, is not considered, a large current (through-current) will flow through these transistors over a significantly long period of time.

FIG. 1 shows an example of a conventional key circuit.

FIGS. 2A to FIG. 2P illustrate timings of signals at various portions in the key circuit when key switch $36_6$ provided between external terminals 32 and 34 is closed. FIG. 2A represents reference pulse signal P, FIG. 2B is sinchronizing signal $\phi A$, FIGS. 2C and 2D are the output signals Q1 and Q2 of binary counters 11 and 12, FIGS. 2E to 2H are time-division signals D1 to D4, which are output from decoder 13, FIGS. 2I to 2L are external signals VK1 to VK4, which are input to external terminals 31 to 34, respectively. FIGS. 2M to 2P are key signals KA to KD, which are output from latch circuits 53 to 56.

In the key circuit of FIG. 1, two binary counters 11 and 12 are connected in series. Counter 11 is input with a fixed period reference pulse signal P (FIG. 2A), and counts it. When counter 11 has counted a predetermined number of pulse signals P, it outputs pulse signal Q1 (FIG. 2C). Output pulse signal Q1 is then input to counter 12, and counted. When counter 12 has counted a predetermined number of pulse signals Q1, it output pulse signal Q2. (FIG. 2D). The output pulses Q1 and Q2 of counters 11 and 12 are input to decoder 13. Decoder 13 generates and outputs time-division signals D1 to D4, (FIGS. 2E to 2H) based on pulse signals Q1 and Q2. Time-division signals D1 to D4 are then inverted by inverters 14 to 17, respectively, and input to buffer circuits 26 to 29. Buffer circuit 26 is composed of P-channel MOS transistor 18 and N-channel MOS transistor 22, which are connected in series between power supply potential $V_{DD}$ and reference potential $V_{SS}$. The gates of transistors 18 and 22 are connected. Buffer circuit 27 is composed of P-channel MOS transistor 19 and N-channel MOS transistor 23, which are also connected in series between power supply potential $V_{DD}$ and reference potential $V_{SS}$. The gates of transistors 19 and 23 are connected. Buffer circuit 28 is composed of P-channel MOS transistor 20 and N-channel MOS transistor 24, which are connected in series between power supply potential $V_{DD}$ and reference potential $V_{SS}$. The gates of transistors 20 and 24 are connected. Buffer circuit 29 is composed of P-channel MOS transistor 21 and N-channel MOS transistor 25, which are connected in series between power supply potential $V_{DD}$ and reference potential $V_{SS}$. The gates of transistors 21 and 25 are connected.

The output signals of buffer circuits 26 to 29 are supplied to external terminals 31 to 34, respectively. Terminal 31 is used exclusively for output, and terminals 32 to 34 both for input and output. External terminal 35 is used for input purposes. Touch-switch type key switches $36_1$ to $36_{10}$ are used between each of pair of the adjacent terminals 31 to 35. The output signals of inverters 15 to 17, which are inversions of time-division signals D2, D3 and D4, are input to AND gate 37. The signal from external terminal 32 is also input to AND gate 37. The output signals of inverters 16 and 17, which are inversions of time-division signals D3 and D4, and also the signal from external terminal 33 are input to AND gate 38. The output signal of inverter 17, which is the inversion of time-division signal D4, and also the signal from external terminal 34 are input to AND gate 39. N-channel MOS transistor 40, which is always in the ON state and whose gate is connected to power supply potential $V_{DD}$, is connected between external terminal 35 and the reference potential $V_{SS}$. The output signals of AND gates 37 to 39 are input and latched into latch circuits 53 to 55, respectively. The signals of AND gates 37 to 39 are synchronized with synchronizing signal $\phi A$ (FIG. 2B), and output as key signals KA to KC (FIGS. 2M to 2O). The signal from external terminal 35 is input and latched into latch circuit 56, where it is synchronized with synchronizing signal $\phi A$, and output as key signal KD (FIG. 2P).

Latch circuit 53 is composed of clocked inverter 41, which receives the output signal from AND gate 37, and operates in synchronism with synchronizing signal $\phi A$; inverter 45, which inverts the output of clocked inverter 41; and clocked inverter 49, which is connected in inverse parallel with inverter 45, and operates in synchronism with the inverted signal of synchronizing signal $\phi A$. Latch circuit 54 is composed of clocked inverter 42, which receives the output signal from AND gate 38, and operates in synchronism with synchronizing signal $\phi A$; inverter 46, which inverts the output of clocked inverter 42; and clocked inverter 50, which is connected in inverse parallel with inverter 46, and operates in synchronism with the inverted signal of synchronizing signal $\phi A$. Latch circuit 55 is composed of clocked inverter 43, which receives the output signal from AND gate 39, and operates in synchronism with synchronizing signal $\phi A$; inverter 47, which inverts the output of clocked inverter 43; and clocked inverter 51, which is connected in inverse parallel with inverter 47, and operates in synchronism with the inverted signal of synchronizing signal $\phi A$. Latch circuit 56 is composed of clocked inverter 44, which receives the output signal from external terminal 35 and operates in synchronism with synchronizing signal $\phi A$; inverter 48, which inverts the output of clocked inverter 44; and clocked inverter 52, which is connected in inverse parallel with inverter 48, and operates in synchronism with synchronizing signal $\phi A$.

Parasitic capacitance is present between external terminals 31 to 35, and between each external terminal and power supply potential $V_{DD}$ or reference potential $V_{SS}$. In order to simplify the drawing, only the capacitance parasitic on external terminal 32, capacitances 57 to 61 are shown in FIG. 1.

In the key circuit configured as explained above, time-division signals D1 to D4 are generated in decoder 13, phase-inverted by inverters 14 to 17, and input to AND gates 37 to 39 respectively. The signals $\overline{D2}$ to $\overline{D4}$, and the signals output from external terminals 32 to 34 are then ANDed by AND gates 37 to 39. These AND signals are then input to the latch circuits, and key signals KA to KD, which correspond to the selective closing of key switches $36_1$ to $36_{10}$, are obtained. In order to detect key signals KA to KD, the dimensions of P-channel MOS transistors 18 to 21 with on-resistance of Rp and N-channel MOS transistors 22 to 25 and 40 with on-resistance of Rn, are set so that Rp is smaller than Rn (Rp<Rn).

In the key switch circuit of FIG. 1, when a key switch, for example, key switch $36_6$, is closed, after the time-division signal D2 is output from decoder 13, key signals KA to KD will be logic levels "0", "0", "1" and "0", respectively. With detection of these key signals KA to KD, it can be understood that key switch $36_6$ is closed.

FIG. 3 is an equivalent circuit of the circuit shown in FIG. 1, when key switch $36_6$ is closed.

As shown in FIG. 3, the equivalent circuit is composed of inverters 15 and 17, buffer circuits 27 and 29, external terminals 32 and 34, AND gates 37 and 39, and on-resistance Rkey of key switch $36_6$, which is connected between external terminals 32 and 34. Capacitor C represents the external load capacitance of external terminals 32 and 34, or parasitic capacitance.

FIGS. 4A to 4E show the timing charts at various portions in the equivalent circuit of FIG. 3. In the equivalent circuit of FIG. 3, during the period that time-division signal D2 is at "1" level, the P-channel MOS transistor 19 in buffer circuit 27 is turned on. At this time, the time-division signal D4 is at "0" level and N-channel MOS transistor 25 in buffer circuit 29 is also turned on. Accordingly, at this time, the potential VK2 is determined by the voltage division of the on-resistance Rp of the P-channel MOS transistor 19 in buffer circuit 27, the on-resistance Rkey of key switch $36_6$, and the on-resistance Rn of N-channel MOS transistor 25 in buffer circuit 29. At this time, a through-current flows between power supply potential $V_{DD}$ and reference potential $V_{SS}$. On the other hand, during the period that time-division signal D4 is "1" level, P-channel MOS transistor 21 in buffer circuit 29 is in the ON state. Time-division signal D2 is at "0" level, and N-channel MOS transistor 23 in buffer circuit 29 is ON. The potential VK4 at external terminal 34 is determined by the voltage division produced by the on-resistance Rp of P-channel MOS transistor 21 in buffer circuit 29, the on-resistance Rkey of key switch $36_6$, and the on-resistance Rn of N-channel MOS transistor 23 in buffer circuit 27. At this time, a current flows between power supply potential $V_{DD}$ and reference potential $V_{SS}$. In this circuit, during the period T1 that signals D2 and D4 are at "1" level, as shown by T1 of FIGS. 4A to 4E, a through-current will flow.

The through-current, Ishort is given by $$Ishort = V_{DD}/(Rp + Rkey + Rn) \qquad 1$$
$$= V_{DD}/Rn$$

where, Rp+Rkey<Rn. As may be seen from the equation (1), through-current Ishort depends on the on-resistance Rn of N-channel MOS transistors 23 and 25 in buffer circuits 27 and 29. The larger these values is, the lower the through-current value is.

Also, during the period that signal D2 is at "1" level, the potential VK2 of external terminal 32, which receives its input from AND gate 37, can be expressed $$VK2 = Rn \cdot V_{DD}/(Rp+Rkey+Rn) \qquad 2$$

As seen from the above equation (2), potential VK2 of external terminal 32 increases as the on-resistance value Rn of N-channel MOS transistor 25 in buffer circuit 29 increases, and the input margin is thereby improved. This relationship also applies to the potential VK4 at external terminal 34. When signal D4 is at "1" level, the value of potential VK4 of external terminal 34, which receives its input from AND gate 39, is $$VK4 = Rn \cdot V_{DD}/(Rp+Rkey+Rn) \qquad 3$$

During the period T1, when the through-current is flowing, the external load capacitors C are charged by potential $V_{DD}$; then, if D2 or D4 is changed to "0" level (represented by period T2), then these capacitor C will be discharged by N-channel MOS transistors 23 and 25 in buffer circuits 27 and 29. Then, the potential VK2 at external terminal 32, which varies in accordance with the transient phenomenal characteristics at the time of this discharge, is expressed $$VK2 = e(t) = V_{DD} \cdot e^{-\frac{t}{C \cdot Rn}} \qquad 4$$

This may correspondingly be applied for the potential VK4 at terminal 34, and is given.

$$VK4 = e(t) = V_{DD} \cdot e^{-\frac{t}{C \cdot Rn}} \qquad 5$$

During the period of time T2 from the discharge start time t0 to the time t1 at which the synchronizing signal φA drops, if e(t) does not drop to such a potential that AND gate 37 or 39 detects that the level of e(t) is "0" level, an error operation will occur.

Recent technology in this field improves the checking ability by the key to shorten the detection time period. Further, use of large key switches or film keys increases the load capacitance C. Allowing for these facts, the smaller the on-resistance value of Rn of N-channel MOS transistors 22 to 25 in buffer circuit 26 to 29, the better the input margin response during time period T2.

In the past, the appropriate setting of the on-resistance of N-channel MOS transistors in the buffer circuit has been used to solve the two reciprocal problems concerning through-current and key input margin. Therefore, undesirable limitations must be imposed on the process parameters in manufacturing N-channel MOS transistors in integrated circuits. Further, the key switch 36 used must have small on-resistance and capacitance. This leads to increase of production cost.

SUMMARY OF THE INVENTION

Accordingly, an object of this invention is to provide a key circuit which can be manufactured at low cost, and in which a through-current is small and a characteristic of a key input margin is improved.

According to this invention, there is provided a key circuit comprising:

a plurality of external terminals;

a plurality of key switches inserted between each of different pairs of the external terminals;

a logic circuit for generating a plurality of time-division signals on the basis of a reference pulse signal, and for stopping the generation of said time-division signals during a blanking period with a predetermined time duration;

a plurality of buffer circuits for outputting signals supplied to the plurality of the external terminals;

a detection circuit for detecting the closed key switches of the plurality of the key switches on the basis of the time-division signal and signals derived from the external terminals for key signal inputting; and a plurality of switch means inserted between each of the plurality of the external terminals and a reference potential, the switch means being conductive during the blanking period.

A key circuit according to an embodiment of this invention will be described with reference to the drawings below.

BRIEF DESCRIPTION OF THE DRAWINGS

FIG. 5 is a circuit diagram showing a key circuit according to an embodiment of this invention;

DETAILED DESCRIPTION OF THE PREFERRED EMBODIMENTS

FIG. 5 shows a block diagram of the key circuit according to an embodiment of this invention.

Figure 6:
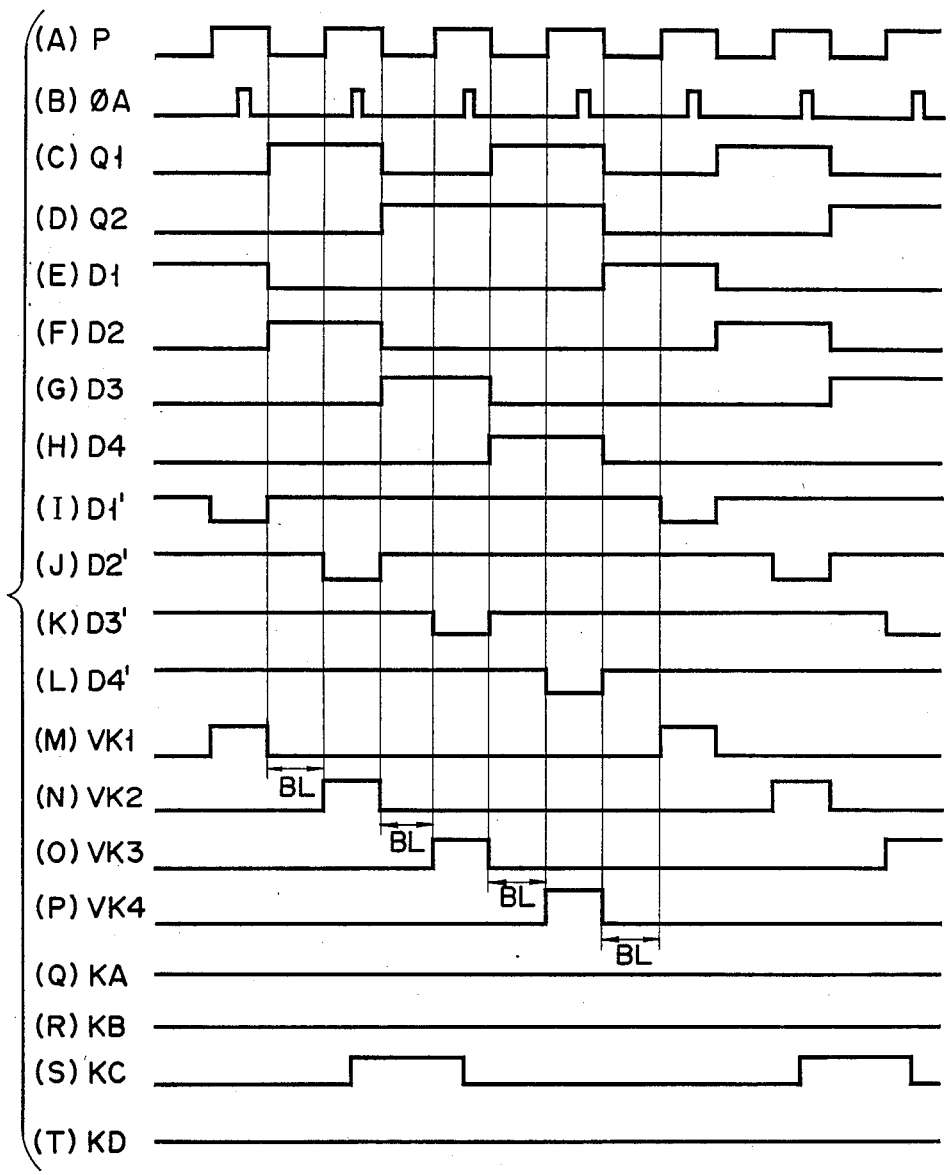
FIGS. 6A to 6T show timing charts of signals at various portions in the FIG. 5 circuit.

FIGS. 6A to 6T show the timing charts of the signals at various portions of the key circuit when key switch $36_6$ between external terminals 32 and 34 is closed. FIG. 6A shows the reference pulse signal P. FIG. 6B shows the synchronizing signal $\phi A$. FIGS. 6C and 6D show the output signals Q1 and Q2 of counters 11 and 12. FIGS. 6E to 6H show the time-division signals D1 to D4. FIGS. 6I to 6L show inverted logic product signals D1' to D4', which are output from NAND gates 71 to 74 respectively. FIGS. 6M to 6P illustrate signals VK1 to VK4, which appear at external terminals 31 to 34. FIGS. 6Q to 6T show key signals KA to KD, which are output from latch circuits 53 to 56.

Figure 1:
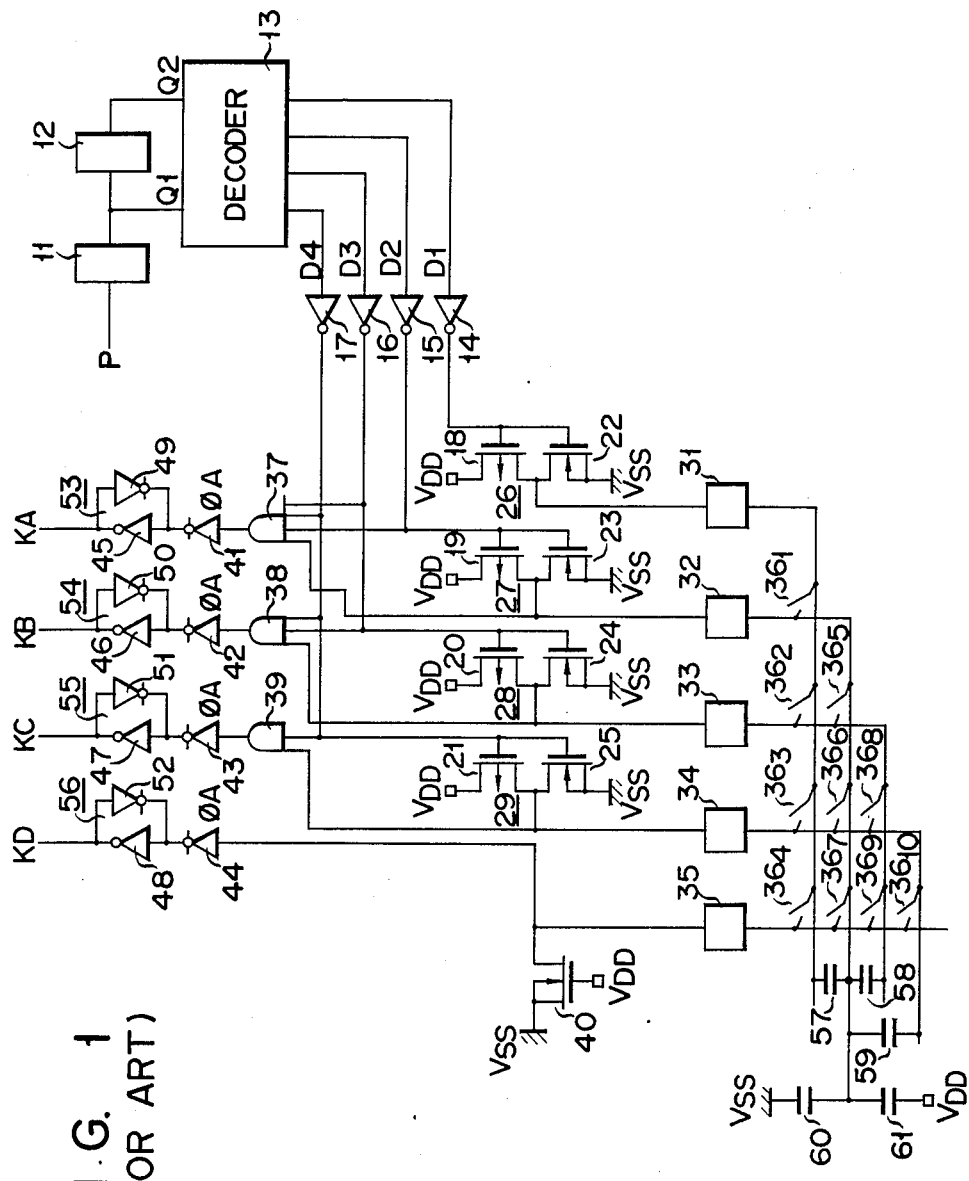
FIG. 1 Shows a circuit diagram of an example of a prior art key circuit.
Figure 2:
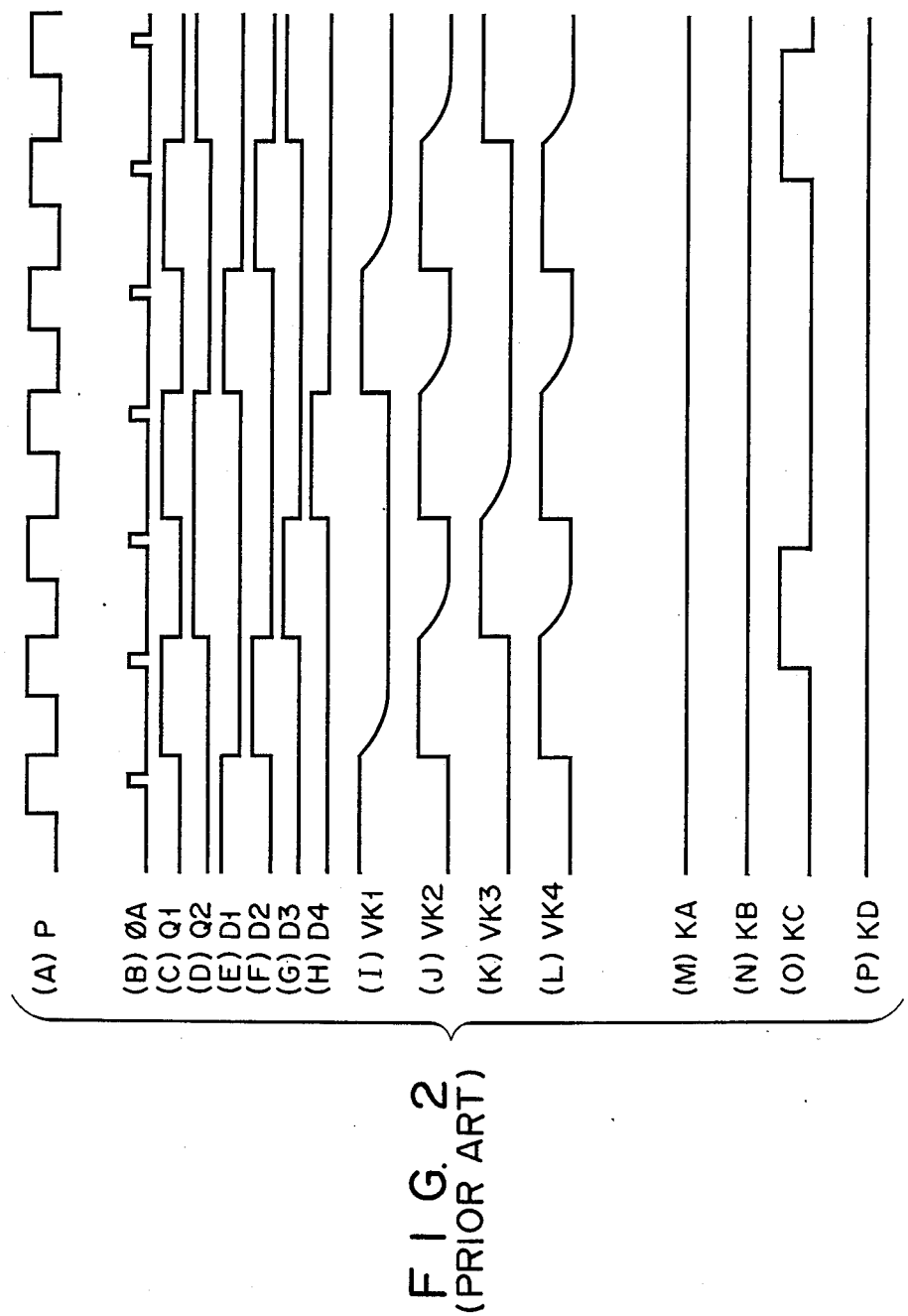
FIGS. 2A to 2P show timing charts of signals at various portions in the key circuit of FIG. 1.
Figure 3:
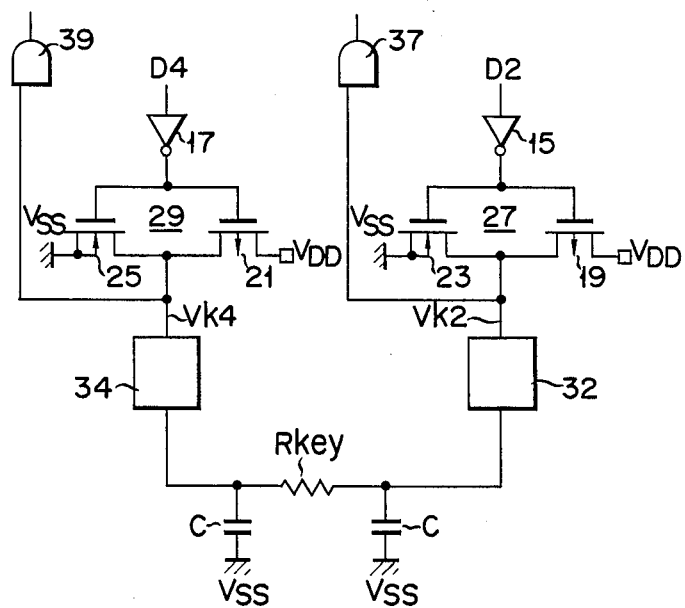
FIG. 3 shows an equivalent circuit of the FIG. 1 circuit when a specified key switch is closed.
Figure 4:
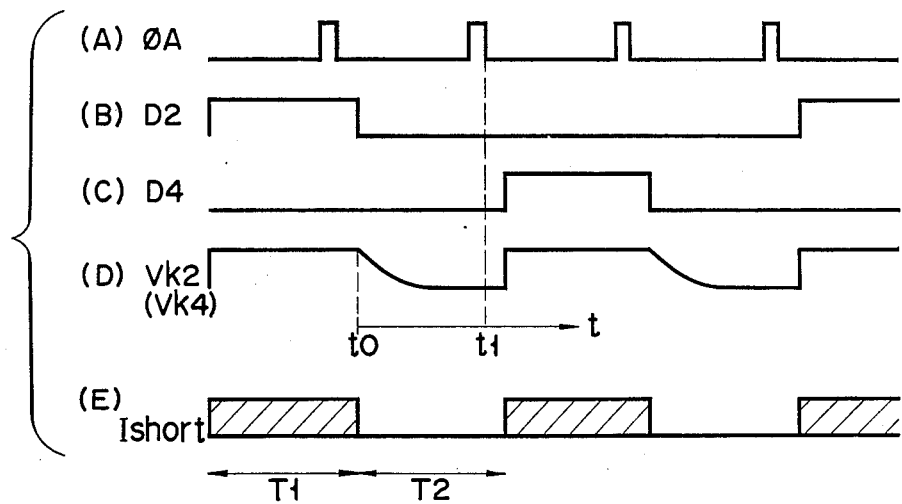
FIGS. 4A to 4E are timing charts of signals at various portions in the FIG. 3 equivalent circuit.

When compared with the prior art circuit of FIG. 1 the following points of this embodiment differ. The inverters 14 to 17 of the FIG. 1 circuit are replaced by NAND gates 71 to 74. Time-division signals D1 to D4 from decoder 13 are supplied to these NAND gates 71 to 74. Also, the fixed period reference pulse signal P is input, as a blanking signal. N-channel MOS transistors 75 to 78, which have lower on-resistance than N-channel MOS transistors 22 to 25, respectively, are provided between each external terminal 31 to 34 and the reference potential $V_{SS}$. Also, N-channel MOS transistor 79, which has a lower on-resistance than N-channel transistor 40, is used between external terminal 35 and the reference potential $V_{SS}$. Reference pulse signal P is phase-inverted by inverter 80, and input to the gates of MOS transistors 75 to 79.

In the circuit of this embodiment, two binary counters 11 and 12, are connected in series. Counter 11 receives the fixed period reference pulse signal P (FIG. 6A), and counts it. When counter 11 has counted a specified number of pulse of signal P, it outputs pulse signal Q1 (FIG. 6C). Pulse signal Q1 is input to, and counted by counter 12. When counter 12 has counted a specified number of pulses of signals Q1, it outputs pulse signal Q2. Pulse signals Q1 and Q2 output from counters 11 and 12 are input to decoder 13. Decoder 13 generates time-division signals D1 to D4 (FIGS. 6E to 6H) on the basis of pulse signals Q1 and Q2, and outputs them. Time-division signals D1 to D4 are input to one input terminal of each NAND gate 71 to 74. The reference pulse signal P is input to the other input terminal of each NAND gate 71 to 74. The output signals of NAND gates 71 to 74 are input to buffer circuits 26 to 29, respectively. Buffer circuit 26 is composed of P-channel MOS transistor 18 and N-channel MOS transistor 22, which are connected in series between power supply potential $V_{DD}$ and reference potential $V_{SS}$. The gates of transistors 18 and 22 are connected. Buffer circuit 27 is composed of P-channel MOS transistor 19 and N-channel MOS transistor 23, which are connected in series between power supply potential $V_{DD}$ and reference potential $V_{SS}$. The gates of transistors 19 and 23 are connected. Buffer circuit 28 is composed of P-channel MOS transistor 20 and N-channel MOS transistor 24, which are connected in series between power supply potential $V_{DD}$ and reference potential $V_{SS}$. The gates of transistors 20 and 24 are connected. Buffer circuit 29 is composed of P-channel MOS transistor 21 and N-channel MOS transistor 25, which are connected in series between power supply potential $V_{DD}$ and reference potential $V_{SS}$. The gates of transistors 21 and 25 are connected.

The output signals from buffer circuits 26 to 29 are input to external terminals 31 to 34, respectively. Terminal 31 is used exclusively for output, and terminals 32 to 34 are used for both input and output. External terminal 35 is used as an input terminal. Touch-switch type key switches $36_1$ to $36_{10}$ are each used between each of the terminals 31 to 35. The output signals of NAND gates 72 to 74, which are the inverted AND signals D2', D3' and D4' of time-division signals D2, D3 and D4, and reference pulse signal P are input to AND gate 37. The signal from external terminal 32 is also input to AND gate 37. The outputs of NAND gates 73 and 74, which are inverted AND signals D3' and D4' of time-division signals D3 and D4, and reference pulse signal P are input to AND gate 38. The signal from external terminal 33 is also input to AND gate 38. The output signal of NAND gate 74, which is the inverted AND signal D4' of time-division signal D4 and reference pulse signal P are input to AND gate 39, and the signal from external terminal 34 is also input to AND gate 39. N-channel MOS transistor 40, which is always in the ON state, and the gate of which is connected to the power supply potential $V_{DD}$, is connected between external terminal 35 and the reference potential $V_{SS}$ The output signals of AND gates 37 to 39 are input to latch circuits 53 to 55, and latched and synchronized with synchronizing signal $\phi A$, finally and output as key signals KA to KC. The signal from external terminal 35 is latched into latch circuit 56, synchronized with synchronizing signal $\phi A$, and output as key signal KD. Latch circuit 53 is composed of clocked inverter 41, which receives the output signal of AND gate 37, and which operates in synchronism with synchronizing signal $\phi A$; inverter 45, which inverts the output signal of clocked inverter 41; and clocked inverter 49, which is connected in inverse parallel with inverter 45 and operates in synchronism with the inverted signal of synchronizing signal $\phi A$. Latch circuit 54 is composed of clocked inverter 42, which receives the output signal of AND gate 38, and operates in synchronism with synchronizing signal $\phi A$; inverter 46 which inverts the output signal of clocked inverter 42; and clocked inverter 50, which is connected in inverse parallel with inverter 46, and operates in synchronism with synchronizing signal $\phi A$. Latch circuit 55 is composed of clocked inverter 43, which receives the output of AND gate 39, and operates in synchronism with synchronizing signal $\phi A$; inverter 47, which inverts the output signal of clocked inverter 43; and clocked inverter 51, which is connected in inverse parallel with inverter 47, and operates in synchronism with synchronizing signal $\phi A$. Latch circuit 56 is composed of clocked inverter 44, which receives the output signal of external terminal 35, and operates in synchronism with synchronizing signal $\phi A$; inverter 48, which inverts the output signal of clocked inverter 44; and clocked inverter 52, which is connected in inverse parallel with inverter 48, and operates in synchronism with synchronizing signal $\phi A$.

The inverted logical products D1' to D4' of these signals D1 to D4 and the reference pulse signal P are generated by NAND gates 71 to 74. These logical product signals are input to AND gates 37 to 39, which then logically multiply these signals and the signals coming from external terminals 32 to 34. These logical product signals are applied to a latch circuit. On the basis of the signals as input to the latch circuit, key signals KA to KD are obtained, which correspond to selective closings of key switches $36_1$ to $36_{10}$. In order to detect the key signals KA to KD, the dimensions of P-channel MOS transistors 18 to 21 each with on-resistance of Rp, and N-channel MOS transistors 22 to 25 and 40 each with on-resistance of Rn, are set so that Rp is smaller than Rn (Rp<Rn).

Parasitic capacitance is present between external terminals 31 to 35, and between each external terminal and power supply potential $V_{DD}$ or reference potential $V_{SS}$. In order to simplify the drawing, only the capacitance parasitic on external terminal 32, capacitances 57 to 61, are illustrated in FIG. 5.

Figure 9:
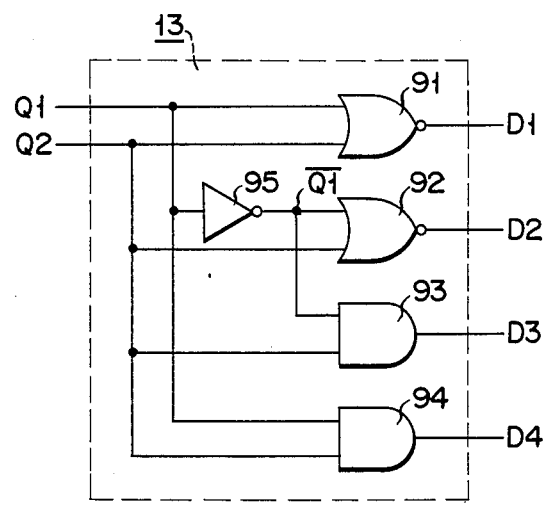
FIG. 9 shows a circuit diagram of a decoder in the FIG. 5 key circuit.

FIG. 9 shows the detailed circuit of decoder 13 in the key circuit of FIG. 5. The decoder shown in FIG. 9 is composed of NOR gates 91 and 92, AND gates 93 and 94, and inverter 95. NOR gate 91 receives the output signal Q1 of counter 11 and output signal Q2 of counter 12, and outputs their inversed logical product as time-division signal D1. NOR gate 92 receives as input signals signal Q2 and signal $\overline{Q1}$ as phase-inverted to signal Q1 by inverter 95, and outputs their inversed logical product as time-division signal D2. AND gate 93 receives signal Q2 and signal $\overline{Q1}$ as phase-inverted to signal Q1 by inverter 95, and outputs the AND signal as time-division signal D3. AND gate 94 receive signals Q1 and Q2, and outputs their logical product signal as time-division signal D4.

In the circuit of FIG. 5, time-division signals D1 to D4, which are output from decoder 13, are supplied to NAND gates 71 to 74, respectively. Pulse signal P is also supplied to NAND gates 71 to 74. As shown in timing charts of FIGS. 6A to 6T, when pulse signal P is at level "0", even if the signals D1 to D4 are level "1", the signals D1' to D4', output from NAND gates 71 to 74 will be forced to remain at level "1". In other words, the period during which signal P is at "0" level, is used as the blanking period. During this period, the outputting of time-division signals D1' to D4' is essentially stopped. With this feature, the period that the through-current Ishort is generated through key switch 36, as referred to in the prior description, is reduced half when compared with that of the prior circuit. Therefore, the reduced amount of power is consumed in this key circuit of this embodiment.

Figure 7:
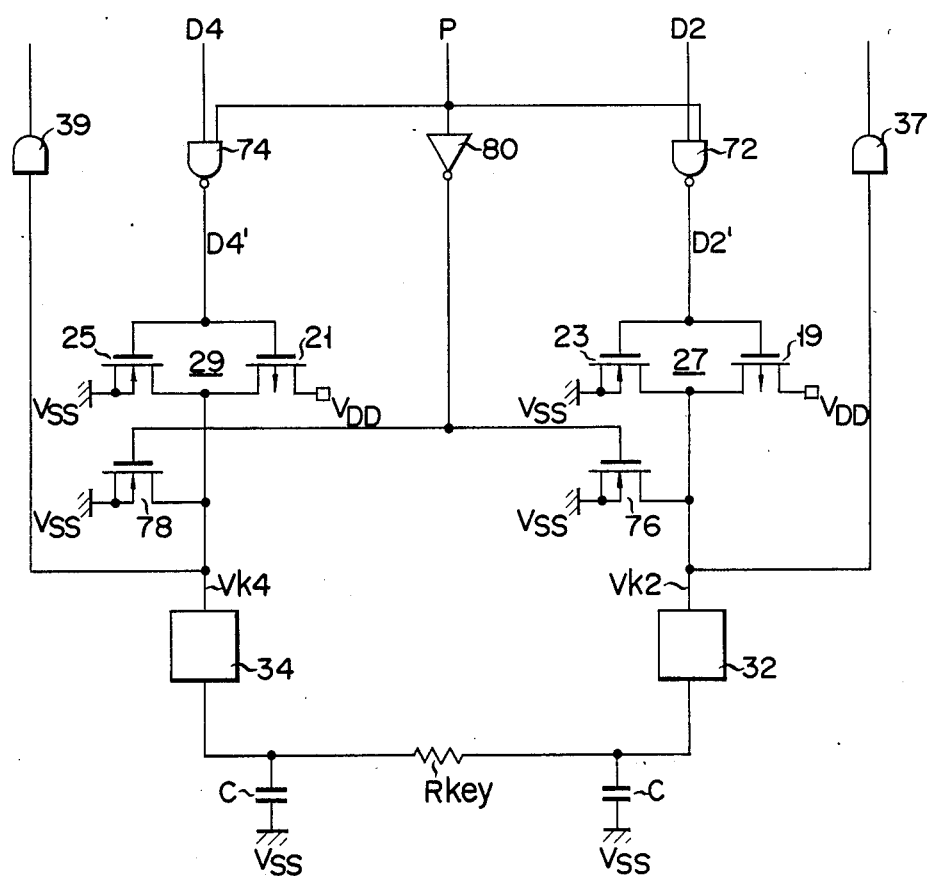
FIG. 7 shows an equivalent circuit of the FIG. 5 key circuit when a specific key is closed.
Figure 8:
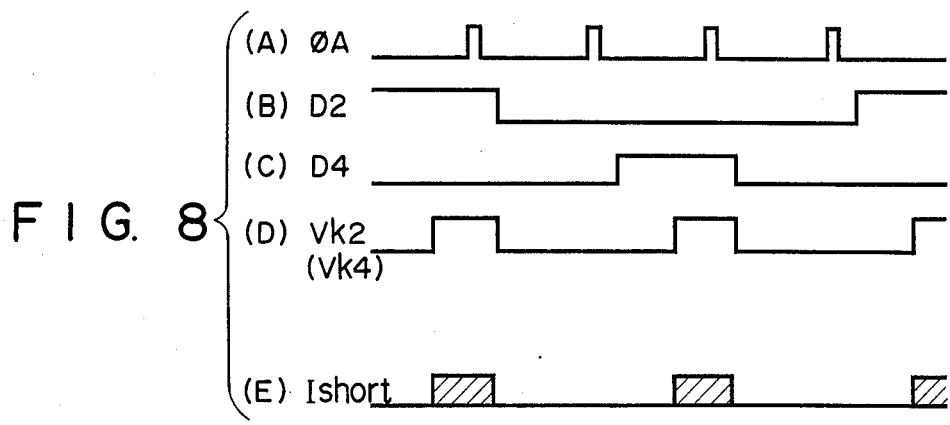
FIGS. 8A to 8E show timing charts of signals at various portions in the equivalent circuit of FIG. 5.

FIG. 7 is an equivalent circuit diagram of the FIG. 5 circuit, when key switch $36_6$ is closed. FIGS. 8A to 8E show the timing charts of the signals at various portions of the equivalent circuit diagram of FIG. 8.

As shown in FIG. 7, the equivalent circuit is composed of NAND gates 72 and 74, buffer circuits 27 and 29, external terminals 32 and 34, N-channel MOS transistors 76 and 78, AND gates 37 and 39, inverter 80, and the on-resistance Rkey of key switch $36_6$, which is connected between external terminals 32 and 34. C represents an external load capacitance of external terminals 32 and 34, viz. parasitic capacitance.

In the equivalent circuit of FIG. 7, during the period that time-division signal D2 is "1" level, if pulse signal P is changed to "1" level, output signal D2' of NAND gates 72 will be "0" level, and P-channel MOS transistor 19 in buffer circuit 27 will be in the ON state. If, at this time, time-division signal D4 is "0" level, the signal D4' output from NAND gate 74 will be "1" level, and N-channel MOS transistor 25 in buffer circuit 29 will be in the ON state. Accordingly, the value of potential VK2 at terminal 32 is determined by the voltage division, which is made by the on-resistance Rp of P-channel MOS transistor 19 in buffer circuit 27, the on-resistance Rkey of key switch $36_6$, and the on-resistance Rn of N-channel MOS transistor 25 in buffer circuit 29. Rp+Rkey<Rn. A through-current flows between the power supply potential $V_{DD}$ and reference potential $V_{SS}$. However, the period in which the through-current is generated is half that of the conventional circuit, because the period in which signal D2' is at "0" level is half the "1" level period of the original D2 signal.

During the period that time-division signal D4 is "1" level, if pulse signal P is changed to "1" level, output signal D4' of NAND gates 74 will be "0" level, and P-channel MOS transistor 21 in buffer circuit 29 will be in the ON state. If, at this time, time-division signal D2 is "0" level, the signal D2' output from NAND gate 72 will be "1" level, and N-channel MOS transistor 23 in buffer circuit 27 will be in the ON state. Accordingly, the value of potential VK4 (the same as potential VK2)

at terminal 34 is determined by the voltage division, which is made by the on-resistance Rp of P-channel MOS transistor 21 in buffer circuit 29, the on-resistance Rkey of key switch $36_6$, and the on-resistance Rn of N-channel MOS transistor 23 in buffer circuit 27. Rp+Rkey<Rn. A through-current flows between the power supply potential $V_{DD}$ and reference potential $V_{SS}$. However, the period in which the through-current is generated is half that of the conventional circuit, because the period in which signal D4' is at "0" level is half the "1" level period of the original D4 signal.

When signals D2' and D4' are at "1" level, N-channel MOS transistors 23 and 25 in buffer circuits 27 and 29 are placed in the ON state, and the load capacitance C of key switch $36_6$ is discharged. When the pulse signal P is now at "0" level, that is, during the blanking period, N-channel MOS transistors 76 and 78 are turned on by the output signal of inverter 80, which inverts pulse signal P, and the load capacitance C is discharged via the parallel connected transistors 23 and 76, or through transistors 25 and 78. Then, external terminals 32 and 34 are quickly discharged, and the potentials VK2 and VK4 are quickly changed to "0" level. For this reason, the time period corresponding to time period T1 of FIGS. 4A to 4E is reduced greatly, and the input signal of AND gate 37 or 39 will be "0" until the clock signal $\phi$A level falls.

Since the above discharge function is accelerated by turning on of transistors 76 and 78, the on-resistance of N-channel MOS transistors 23 and 25 in buffer circuits 27 and 29 can be increased. Therefore, the through-current can also be reduced. Furthermore, the potential of the external terminal, which is produced in a voltage division manner, can be increased. Therefore, the key input margin during the conducting period of the P-channel transistors can be increased.

Thus, according to the above-mentioned as seen from foregoing, the blank period is provided in the time divisional signal. During this blank period, external terminals 31 to 35 are abruptly discharged by N-channel MOS transistors 75 to 79. Therefore, the reciprocal problems of the through-current and the key input margin can be solved simultaneously. Therefore, it is not necessary to control the values of on-resistance of N-channel MOS transistors 22 to 25 in buffer circuits 26 to 29 as accurately as was necessary before, and the excessive limitations on the process parameters in fabricating of the integrated circuits is not necessary. Also, the on-resistance of key switch 36 does not cause a problem. Sufficient speed discharge can be obtained without having to use a key switch 36 with a small capacitance. Due to the above features, production cost can be greatly reduced.

It should be understood that this invention is not limited to the above-mentioned embodiments, but may be variously changed and modified within the scope of the invention. In the above-mentioned embodiment, the blank periods of the time divisional signals D1 to D4 are formed by using the reference pulse signal P. It is noted, however, that the reference pulse signal may be replaced by any signal, if it does not contain the "1" level period of the clock signal $\phi$A as the latch control signal for latch circuits 53 to 56.

As described above, the present invention successfully provides the key circuit with reduced cost to manufacture, in which a through-current is small and a characteristic of a key input margin can be increased.

What is claimed is:

1. A key circuit comprising:
   a plurality of external terminals;
   a plurality of key switches inserted between each of different pairs of said external terminals;
   a logic circuit including decoder means for generating a plurality of time-division signals on the basis of a reference pulse signal, and inverted logic product means for stopping the generation of said time-division signals during a blanking period with a predetermined time duration;
   a plurality of buffer circuits for outputting signals supplied to the plurality of said external terminals;
   a detection circuit for detecting the closed key switches of the plurality of said key switches on the basis of said time-division signal and signals derived from the external terminals for key signal inputting; and
   a plurality of switch means inserted between each of the plurality of said external terminals and a reference potential, said switch means being conductive during said blanking period.

2. A key circuit according to claim 1, wherein said decoder means outputs said time-division signals on the basis of said reference pulse signal, and said inverted logic product means logically multiplies each of said time-division signals and said reference pulse signal, thereby to stop the generation of said time-division signals.

3. A key circuit according to claim 1, wherein each of said buffer circuits includes a P-channel MOS transistor and an N-channel MOS transistor, said transistors being connected in series between the reference potential and a power source potential, the gates of said MOS transistors being connected to the output terminal of said inverted logic product circuit, and the junctions of said transistors being each connected to each of said external terminals.

4. A key circuit according to claim 3, wherein the on-resistance Rp of said P-channel MOS transistor is smaller than the on-resistance Rn of said N-channel MOS transistor (Rp<Rn).

5. A key circuit according to claim 4, wherein the on-resistances Rp and Rn of said P and N-channel MOS transistors, and the on-resistance of said closed switches are given $$Rp+Rkey<Rn$$

where Rkey is the on-resistance of said closed switch.

6. A key circuit according to claim 4, wherein said switch means includes a MOS transistor whose on-resistance is smaller than that of said N-channel MOS transistor.

* * * * *